(12) United States Patent
Nagai

(10) Patent No.: US 10,164,008 B1
(45) Date of Patent: Dec. 25, 2018

(54) SEMICONDUCTOR STRUCTURE AND MANUFACTURING METHOD THEREOF

(71) Applicants: UNITED MICROELECTRONICS CORP., Hsin-Chu (TW); Fujian Jinhua Integrated Circuit Co., Ltd., Quanzhou, Fujian province (CN)

(72) Inventor: Yukihiro Nagai, Saijo (JP)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days.

(21) Appl. No.: 15/613,145

(22) Filed: Jun. 3, 2017

(51) Int. Cl.
  *H01L 29/06* (2006.01)
  *H01L 21/308* (2006.01)
  *H01L 21/762* (2006.01)

(52) U.S. Cl.
  CPC ........ *H01L 29/0649* (2013.01); *H01L 21/308* (2013.01); *H01L 21/76224* (2013.01)

(58) Field of Classification Search
  CPC combination set(s) only.
  See application file for complete search history.

(56) References Cited

U.S. PATENT DOCUMENTS

| | | | |
|---|---|---|---|
| 4,988,639 A | 1/1991 | Aomura | |
| 5,340,755 A | 8/1994 | Zwicknagl | |
| 7,723,170 B2 | 5/2010 | Lim | |
| 8,338,909 B2 | 12/2012 | Fung | |
| 8,502,316 B2 | 8/2013 | Fung | |
| 2006/0046407 A1* | 3/2006 | Juengling | H01L 27/10823 438/301 |
| 2013/0146962 A1* | 6/2013 | Ahn | H01L 27/11565 257/316 |
| 2013/0302968 A1* | 11/2013 | Lin | H01L 21/76224 438/424 |
| 2014/0349464 A1 | 11/2014 | Yang | |
| 2016/0103396 A1 | 4/2016 | Liou | |

OTHER PUBLICATIONS

Koyanagi, Hot-Electron-Induced Punchthrough (HEIP) Effect in Submicrometer PMOSFET's, IEEE Transactions on Electron Devices, vol. ED-34, No. 4, Apr. 1987.

* cited by examiner

*Primary Examiner* — Ratisha Mehta
(74) *Attorney, Agent, or Firm* — Winston Hsu

(57) ABSTRACT

A manufacturing method of a semiconductor structure includes the following steps. A plurality of first trench isolations is formed, and at least a part of each of the first trench isolations is formed in a substrate. A plurality of second trench isolations is formed in the substrate after the step of forming the first trench isolations. Each of the first trench isolations is parallel with each of the second trench isolations. One of the second trench isolations is formed between two of the first trench isolations adjacent to each other, and a pitch between the first trench isolations is equal to a pitch between the second trench isolations. The semiconductor structure includes the substrate, the first trench isolations, and the second trench isolations. A material of the first trench isolations is different from a material of the second trench isolations.

14 Claims, 13 Drawing Sheets

SEMICONDUCTOR STRUCTURE AND MANUFACTURING METHOD THEREOF

BACKGROUND OF THE INVENTION

1. Field of the Invention

The present invention relates to a semiconductor structure and a manufacturing method thereof, and more particularly, to a semiconductor structure including trench isolations and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. Recently, vertical devices, such as vertical memory devices, are developed for increasing the density mentioned above. However, there are some manufacturing issues for forming parts with high aspect ratio in the vertical devices, such as a pattern bending issue for forming trench isolations with high aspect ratio, and the issues have to be solved for improving the manufacturing yield and the device performance.

SUMMARY OF THE INVENTION

It is one of the objectives of the present invention to provide a semiconductor structure and a manufacturing method thereof. In the semiconductor structure, first trench isolations and second trench isolations which are parallel to one another and alternately arranged are formed by separated processes for avoiding the pattern bending issue and improving related device performance.

A manufacturing method of a semiconductor structure is provided in an embodiment of the present invention. The manufacturing method includes the following steps. A plurality of first trench isolations is formed, and at least a part of each of the first trench isolations is formed in a substrate. A plurality of second trench isolations is formed in the substrate after the step of forming the first trench isolations. Each of the first trench isolations is parallel with each of the second trench isolations. One of the second trench isolations is formed between two of the first trench isolations adjacent to each other, and a pitch between the first trench isolations is equal to a pitch between the second trench isolations.

A semiconductor structure is provided in an embodiment of the present invention. The semiconductor structure includes a substrate, a plurality of first trench isolations, and a plurality of second trench isolations. The first trench isolations and the second trench isolations are disposed in the substrate. Each of the first trench isolations is parallel with each of the second trench isolations. One of the second trench isolations is disposed between two of the first trench isolations adjacent to each other, and a pitch between the first trench isolations is equal to a pitch between the second trench isolations. A material of the first trench isolations is different from a material of the second trench isolations.

In the semiconductor structure and the manufacturing method thereof according to the present invention, the second trench isolations are formed after the step of forming the first trench isolations, and the first trench isolations may be used as supporting structures during the step of forming the second trench isolations. The pattern bending issue in the process of forming the first trench isolations and the second trench isolations may be avoided. The manufacturing yield and the device performance may be improved accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-4 are schematic drawings illustrating a manufacturing method of a semiconductor structure according to a first embodiment of the present invention, wherein FIG. 2 is a schematic drawing in a step subsequent to FIG. 1, FIG. 3 is a schematic drawing in a step subsequent to FIG. 2, and FIG. 4 is a schematic drawing in a step subsequent to FIG. 3.

FIGS. 5-7 are schematic drawings illustrating a manufacturing method of a semiconductor structure according to a second embodiment of the present invention, wherein FIG. 6 is a schematic drawing in a step subsequent to FIG. 5, and FIG. 7 is a schematic drawing in a step subsequent to FIG. 6.

FIGS. 8-10 are schematic drawings illustrating a manufacturing method of a semiconductor structure according to a third embodiment of the present invention, wherein FIG. 9 is a schematic drawing in a step subsequent to FIG. 8, and FIG. 10 is a schematic drawing in a step subsequent to FIG. 9.

FIGS. 11-13 are schematic drawings illustrating a manufacturing method of a semiconductor structure according to a fourth embodiment of the present invention, wherein FIG. 12 is a schematic drawing in a step subsequent to FIG. 11, and FIG. 13 is a schematic drawing in a step subsequent to FIG. 12.

DETAILED DESCRIPTION

Figure 1:
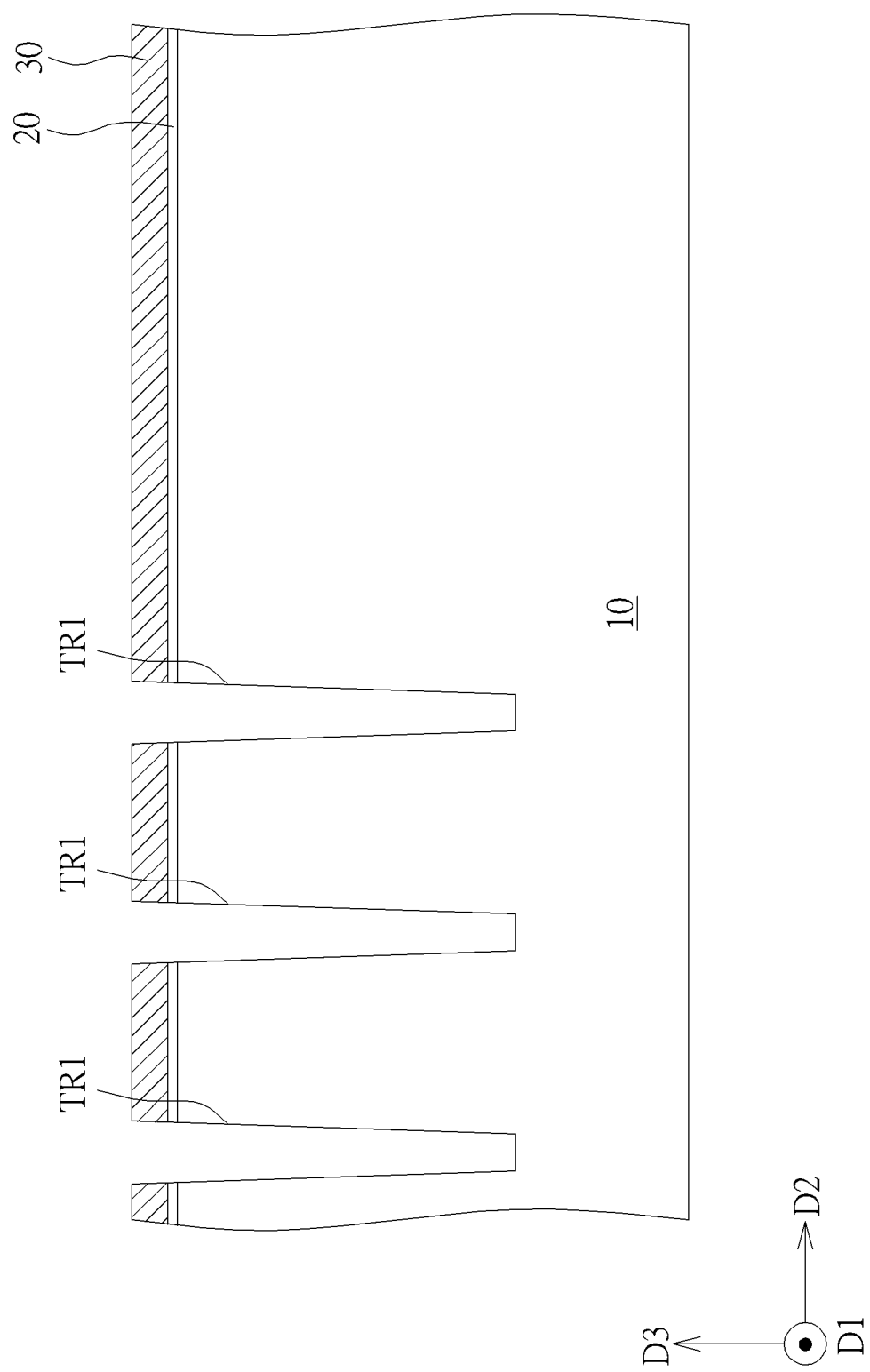
Figure 2:
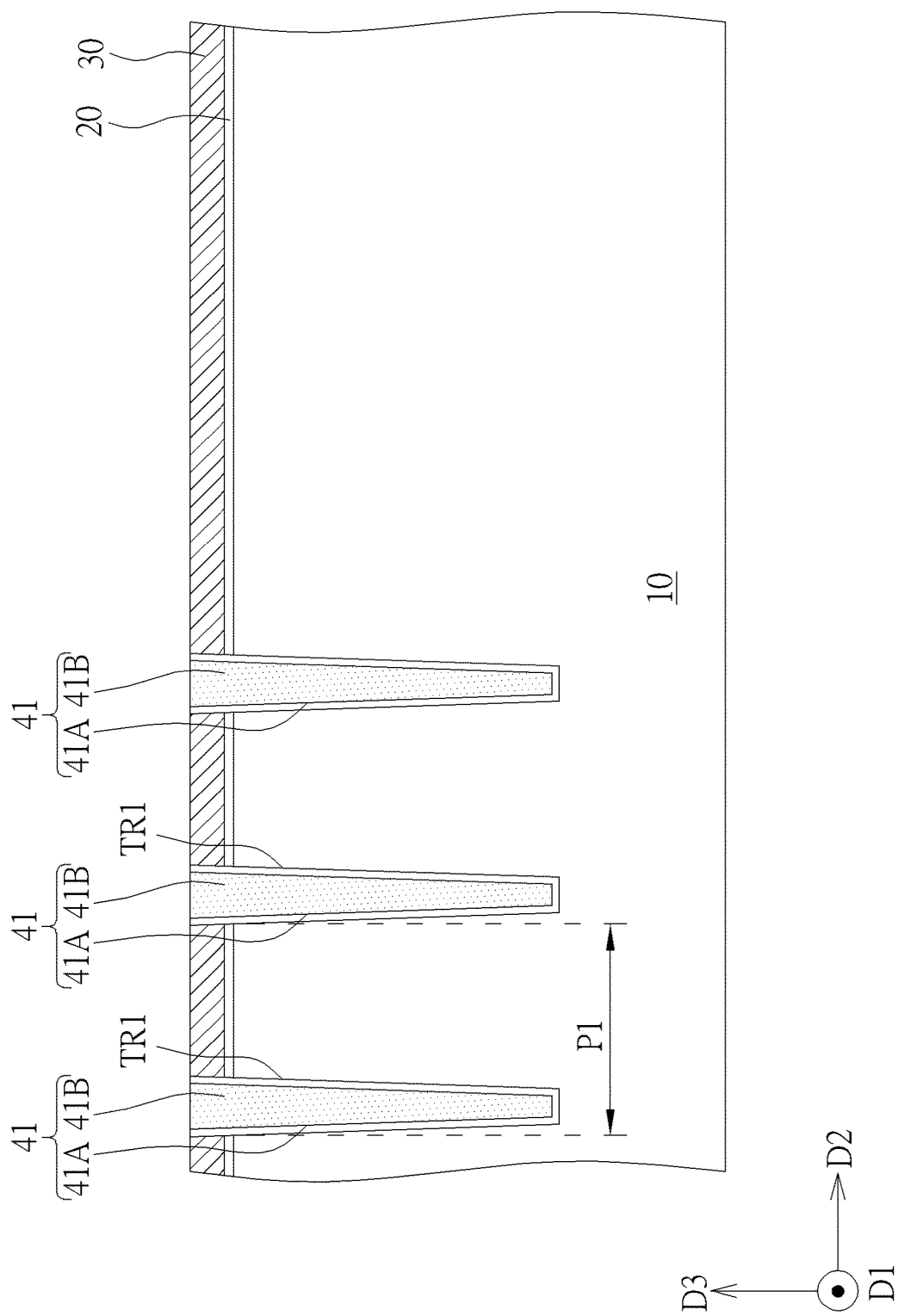

Please refer to FIGS. 1-4. FIGS. 1-4 are schematic drawings illustrating a manufacturing method of a semiconductor structure according to a first embodiment of the present invention. The manufacturing method of the semiconductor structure in this embodiment includes the following steps. As shown in FIG. 1 and FIG. 2, a plurality of first trench isolations 41 is formed, and at least apart of each of the first trench isolations 41 is formed in a substrate 10. The method of forming the first trench isolations 41 may include but is not limited to the following steps. A mask layer 30 may be formed on the substrate 10, and an insulation layer 20 may be optionally formed between the mask layer 30 and the substrate 10. The substrate 10 may include a semiconductor substrate such as a silicon substrate, an epitaxial substrate, a silicon carbide substrate, or a silicon-on-insulator (SOI) substrate, but not limited thereto. The insulation layer 20 may include silicon oxide, silicon nitride, silicon oxynitride, or other suitable insulation materials. The mask layer 30 may include metal mask layer or non-metal mask layer. Subsequently, a plurality of first trenches TR1 may be formed by a patterning process, such as a photolithographic process and an etching process, but not limited thereto. Each of the first trenches TR1 may penetrate the mask layer 30 and the insulation layer 20, and each of the first trenches TR1 extends downwards into the substrate 10. Additionally, each of the first trenches TR1 may extend in a first direction D1, and the first trenches TR1 may repeatedly arranged in a second direction D2. The second direction D2 may be substantially perpendicular to the first direction D1, but not limited thereto. In some embodiments, the first trenches TR1 may have an identical width respectively, and a spacing width between two of the first trenches TR1 immediately adjacent to each other may be a specific and/or fixed value. In other words, the first trenches TR1 may be repeatedly arranged in the second direction D2 by a specific pitch. A first liner 41A may be conformally formed on the surface of the first trenches TR1 and the mask layer 30, and the first trenches TR1 may be filled with a first gap filling material 41B. A removing process, such as a chemical mechanical polishing process, may be performed to remove the first liner 41A and the first gap filling material 41B outside the first trenches TR1. In other words, each of the first trench isolations 41 is formed in one of the first trenches TR1, and each of the first trench isolations 41 may include the first liner 41A and the first gap filling material 41B. In some embodiments, the first liner 41A may include oxide or other suitable insulation materials, and the first gap filling material 41B may include a spin on dielectric (SOD) material, an insulation material formed by a chemical vapor deposition (CVD) process, or other suitable insulation materials formed by other processes. The SOD material mentioned above may include silicon oxide, polysilazane, or other suitable materials. The insulation material formed by the CVD process mentioned above may include silicon oxide, silicon oxide based materials, or other suitable materials.

As shown in FIG. 2, each of the first trench isolations 41 may extend in the first direction D1, and the first trench isolations 41 may be repeatedly arranged in the second direction D2. In some embodiments, each of the first trench isolations 41 may have the same width in the first direction D2, and a spacing width between two of the first trench isolations 41 immediately adjacent to each other may be a specific and/or fixed value. In other words, the first trench isolations 41 may be repeatedly arranged in the second direction D2 by a first pitch P1, but not limited thereto.

Figure 3:
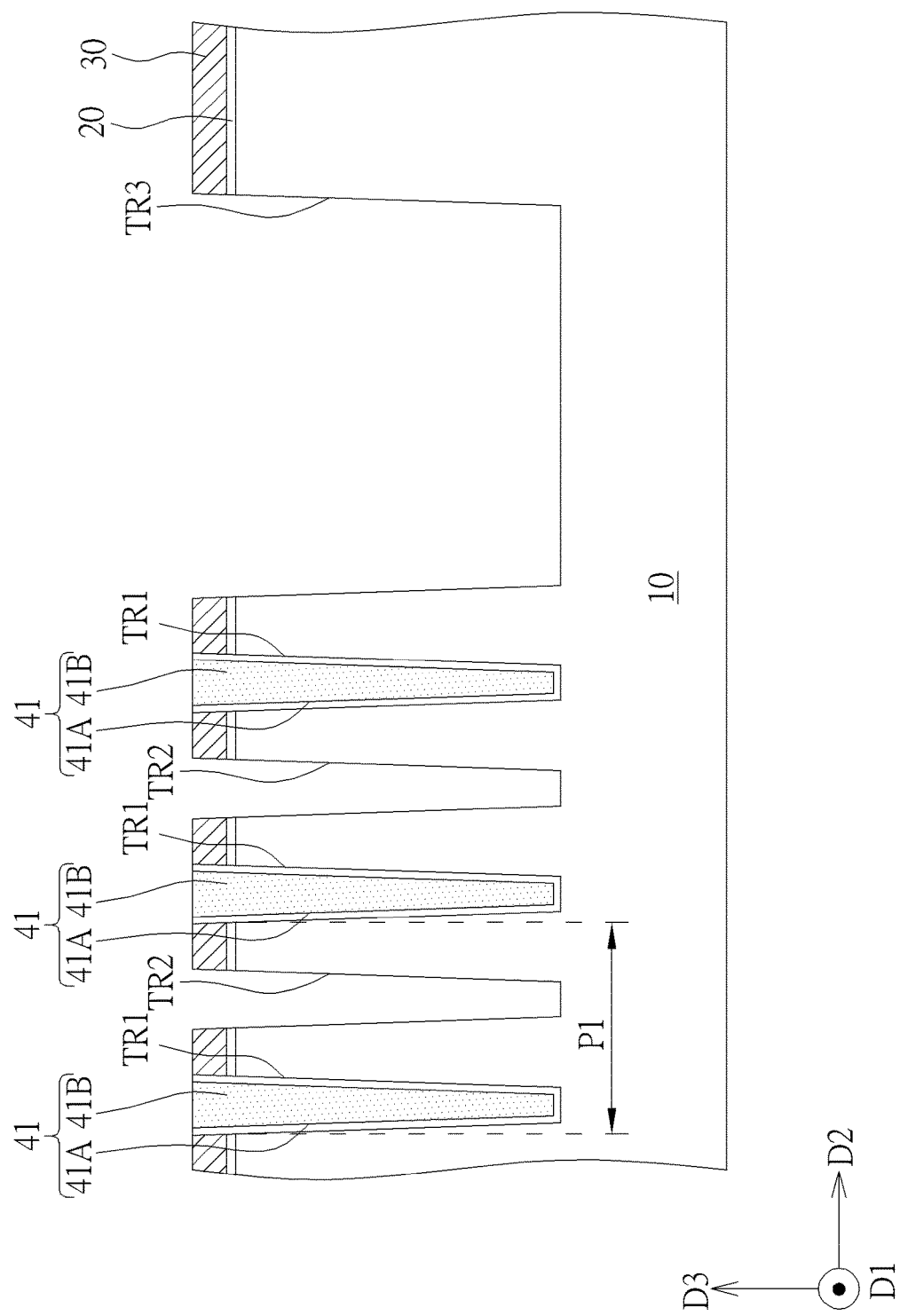
Figure 4:
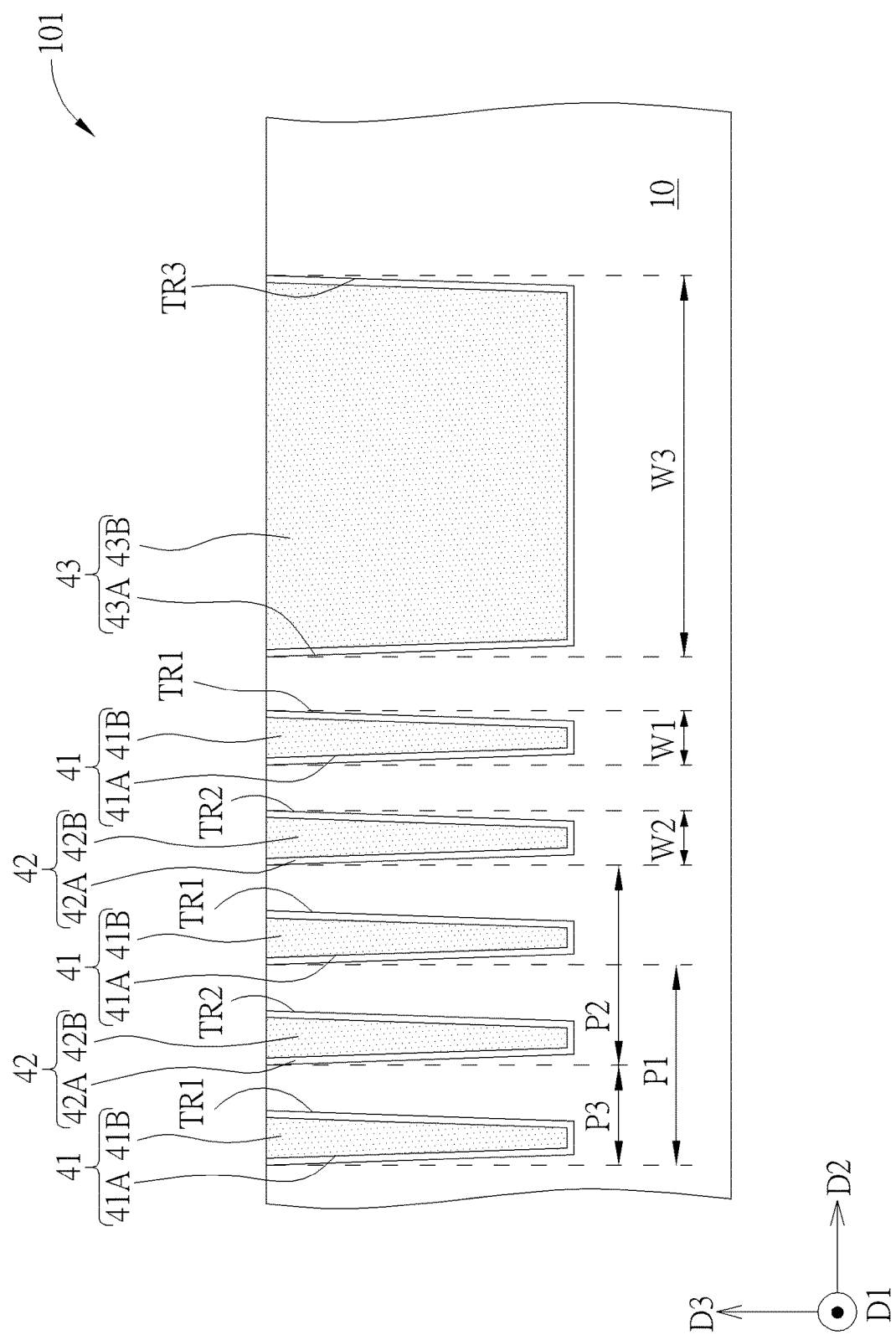

As shown in FIG. 3 and FIG. 4, a plurality of second trench isolations 42 may be formed in the substrate 10 after the step of forming the first trench isolations 41. The method of forming the second trench isolations 42 may include but is not limited to the following steps. A plurality of second trenches TR2 may be formed by a patterning process, such as a photolithographic process and an etching process, but not limited thereto. Each of the second trenches TR2 may penetrate the mask layer 30 and the insulation layer 20, and each of the second trenches TR2 extends downwards into the substrate 10. Additionally, each of the second trenches TR2 may extend in the first direction D1, and the second trenches TR2 may repeatedly arranged in the second direction D2. In other words, each of the second trenches TR2 may be parallel with each of the first trenches TR1, but not limited thereto. At least one of the second trenches TR2 is formed between two of the first trenches TR1 immediately adjacent to each other in the second direction D2. In some embodiments, the second trenches TR2 may have an identical width respectively, and a spacing width between two of the second trenches TR1 immediately adjacent to each other may be a specific and/or fixed value. In other words, the second trenches TR2 may be repeatedly arranged in the second direction D2 by a specific pitch. A second liner 42A may be conformally formed on the surface of the second trenches TR2 and the mask layer 30, and the second trenches TR2 may be filled with a second gap filling material 42B. A removing process, such as a chemical mechanical polishing process, may be performed to remove the second liner 42A and the second gap filling material 42B outside the second trenches TR2. In other words, each of the second trench isolations 42 is formed in one of the second trenches TR2, and each of the second trench isolations 42 may include the second liner 42A and the second gap filling material 42B. In some embodiments, the second liner 42A may include oxide or other suitable insulation materials, and the second gap filling material 42B may include a spin on dielectric material, an insulation material formed by a chemical vapor deposition process, or other suitable insulation materials formed by other processes. The first trench isolations 41 and the second trench isolations 42 may be formed separated processes respectively, and the second gap filling material 42B may be different from or identical to the first gap filling material 41B accordingly.

In some embodiments, each of the second trench isolations 42 may extend in the first direction D1, and the second trench isolations 42 may be repeatedly arranged in the second direction D2. In some embodiments, each of the second trench isolations 42 may have the same width in the first direction D2 (such as a second width W2 shown in FIG. 4), and a spacing width between two of the second trench isolations 42 immediately adjacent to each other may be a specific and/or fixed value. In other words, the second trench isolations 42 may be repeatedly arranged in the second direction D2 by a second pitch P2, but not limited thereto. In some embodiments, each of the first trench isolations 41 may be parallel with each of the second trench isolations 42, and at least one of the second trench isolations 42 may be formed between two of the first trench isolations 41 immediately adjacent to each other in the second direction D2. In other words, the first trench isolations 41 and the second trench isolations 42 may be alternately arranged in the second direction D2. In some embodiments, a pitch between the first trench isolations 41 (such as the first pitch P1 shown in FIG. 4) may be substantially equal to a pitch between the second trench isolations 42 (such as second pitch P2 shown in FIG. 4), but not limited thereto. Additionally, in some embodiments, a width of each of the first trench isolations 41 (such as a first width W1 shown in FIG. 4) may be substantially equal to a width of each of the second trench isolations 42 (such as a second width W2 shown in FIG. 4), and/or a depth of each of the first trench isolations 41 in a vertical direction D3 may be substantially equal to a depth of each of the second trench isolations 42 in the vertical direction D3, but not limited thereto. Accordingly, a pitch between the first trench isolations 41 and the second trench isolations 42 (such as a third pitch P3 shown in FIG. 4) may be substantially equal to half the first pitch P1, but not limited thereto. In some embodiments, the width and/or the depth of the first trench isolation 41 may also be different from the width and/or the depth of the second trench isolation 42.

It is worth noting that the second trenches TR2 may be formed after the step of filling the first trenches TR1 with the first gap filling material 41B, and the first trench isolations 41 may be used as supporting structures for avoiding a pattern bending issue after the step of forming the second trenches TR2 especially when the aspect ratio of each of the second trenches TR2 and/or each of the first trenches TR1 is respectively high (such as higher than 8). Additionally, in some embodiments, the mask layer 30 and the insulation layer 20 may also be removed by the removing process for removing the second gap filling material 42B outside the second trenches TR2, and a semiconductor structure 101 shown in FIG. 4 may be formed by the manufacturing steps described above. As shown in FIG. 4, the semiconductor structure 101 may include the substrate 10, a plurality of the first trench isolations 41, and a plurality of the second trench isolations 42. The first trench isolations 41 and the second trench isolations 42 are disposed in the substrate 10. Each of the first trench isolations 41 is parallel with each of the second trench isolations 42. One of the second trench isolations 42 is disposed between two of the first trench isolations 41 adjacent to each other in the second direction D2. The first pitch P1 between the first trench isolations 41 may be substantially equal to the second pitch P2 between the second trench isolations 42. The material of the first trench isolations 41 may be different from the material of the second trench isolations 42.

As shown in FIG. 3 and FIG. 4, in some embodiments, the manufacturing method may further include forming a third trench isolation 43 in the substrate 10, and a width of the third trench isolation 43 in the second direction D2 (such as a third width W3 shown in FIG. 4) may be larger than the first width W1 of each of the first trench isolations 41 and the second width W2 of each of the second trench isolations 42. In some embodiments, the third trench isolation 43 and the second trench isolations 42 may be formed by the same step. Specifically, a third trench TR3 and the second trenches TR2 mentioned above may be formed simultaneously by the same patterning process, and the third trench isolation 43 may be formed by filling the third trench TR3 with a third liner 43A and a third gap filling material 43B. In some embodiments, a material of the third trench isolation 43 may be the same as the material of the second trench isolations 42, and the material of the third trench isolation 43 may be different from the material of the first trench isolations 41, but not limited thereto. In other words, the third liner 43A may be the same as the second liner 42A, and the third gap filling material 43B may be the same as the second gap filling material 42B, but not limited thereto. In some embodiments, the materials of the first trench isolations 41, the second trench isolations 42, and the third trench isolation 43 may be identical to or different from one another. In some embodiments, the third trench isolation 43 and the first trench isolations 41 may be formed by the same step. Accordingly, the semiconductor structure 101 may further include the third trench isolation 43 disposed in the substrate 10, and the material of the third trench isolation 43 may be different from the material of the first trench isolations 41 or the material of the second trench isolations 42. Additionally, the third width W3 of the third trench isolation 43 in the second direction D2 may be larger than the first width W1 of each of the first trench isolations 41 and the second width W2 of each of the second trench isolations 42, and the third trench isolation 43 may be separated from the first trench isolations 41 and the second trench isolations 42. The semiconductor structure 101 may be used to form semiconductor devices, such as vertical memory devices, metal-oxide-semiconductor (MOS) devices, or other suitable semiconductor devices.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 5:
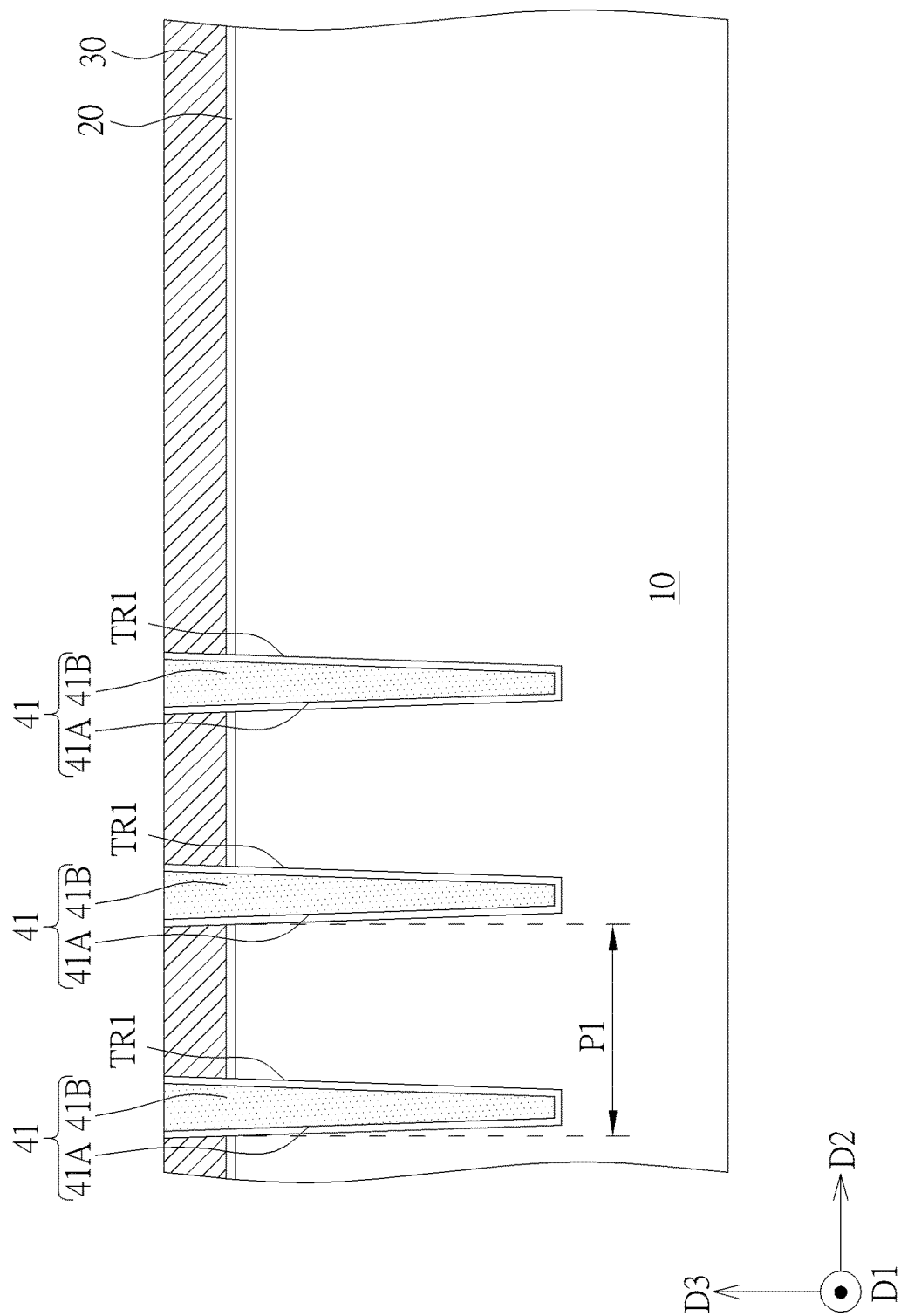
Figure 6:
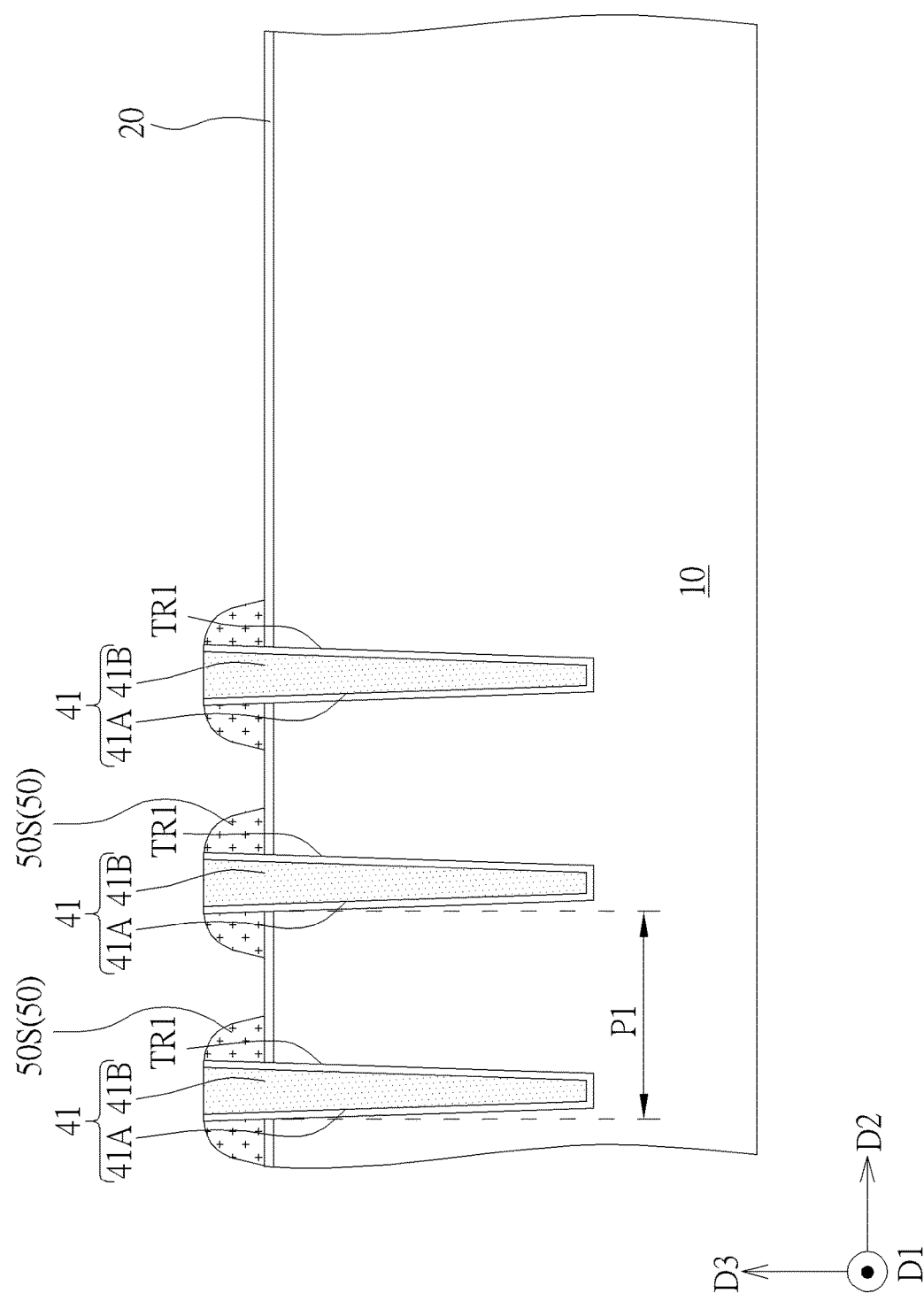
Figure 7:
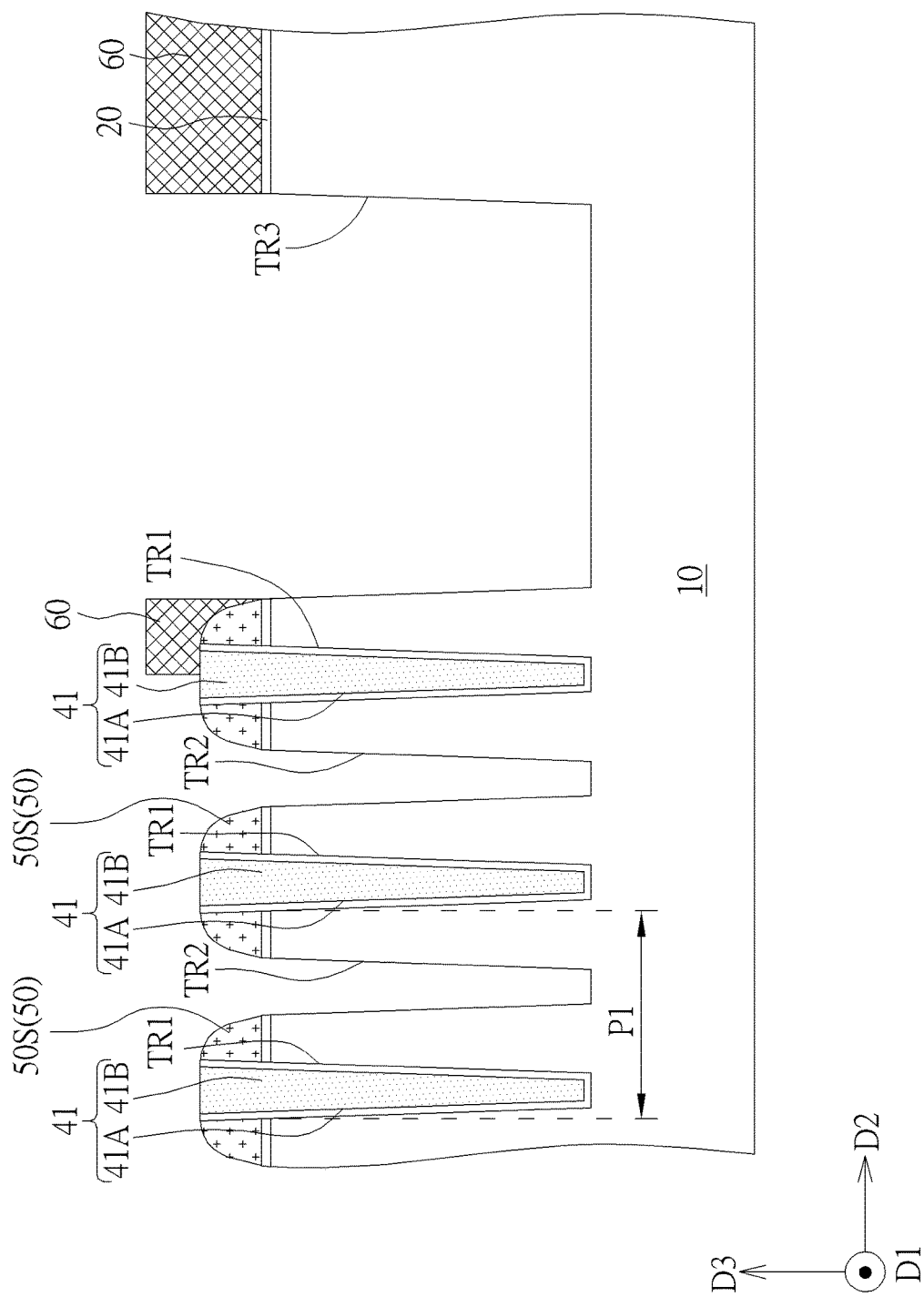

Please refer to FIGS. 5-7. FIGS. 5-7 are schematic drawings illustrating a manufacturing method of a semiconductor structure according to a second embodiment of the present invention. As shown in FIG. 5, the mask layer 30 is formed on the substrate 10, and the first trenches TR1 may be defined by the mask layer 30. As shown in FIG. 5 and FIG. 6, after the step of forming the first trenches TR1 and the step of forming the first trench isolations 41, the mask layer 30 may be removed. A sidewall spacer 50S may be formed on the substrate 10 and on sidewalls of each of the first trench isolations 41 protruding from the substrate 10 and the insulation layer 20 after the step of removing the mask layer 30. The sidewall spacer 50S may be formed by forming a liner mask layer 50 conformally on the insulation layer 20 and the first trench isolations 41 protruding from the insulation layer 20, and performing an anisotropic etching process to the liner mask layer 50, but not limited thereto. Accordingly, for forming the sidewall spacer 50S with required dimensions, the thickness of the mask layer 30 should be precisely controlled. As shown in FIG. 5 and FIG. 6, the second trenches TR2 in this embodiment may be defined by the sidewall spacer 50S. The distances between the second trench TR2 and two of the first trenches TR1 adjacent to the second trench TR2 may be controlled more precisely because the second trenches TR may be defined by the sidewall spacer 50S and formed self-aligned between two adjacent first trenches TR1. Additionally, the third trench TR3 in this embodiment may be defined by another mask layer such as a patterned resist layer 60 formed on the substrate 10, and the patterned resist layer 60 may be formed after the step of forming the sidewall spacer 50S, but not limited thereto.

Figure 8:
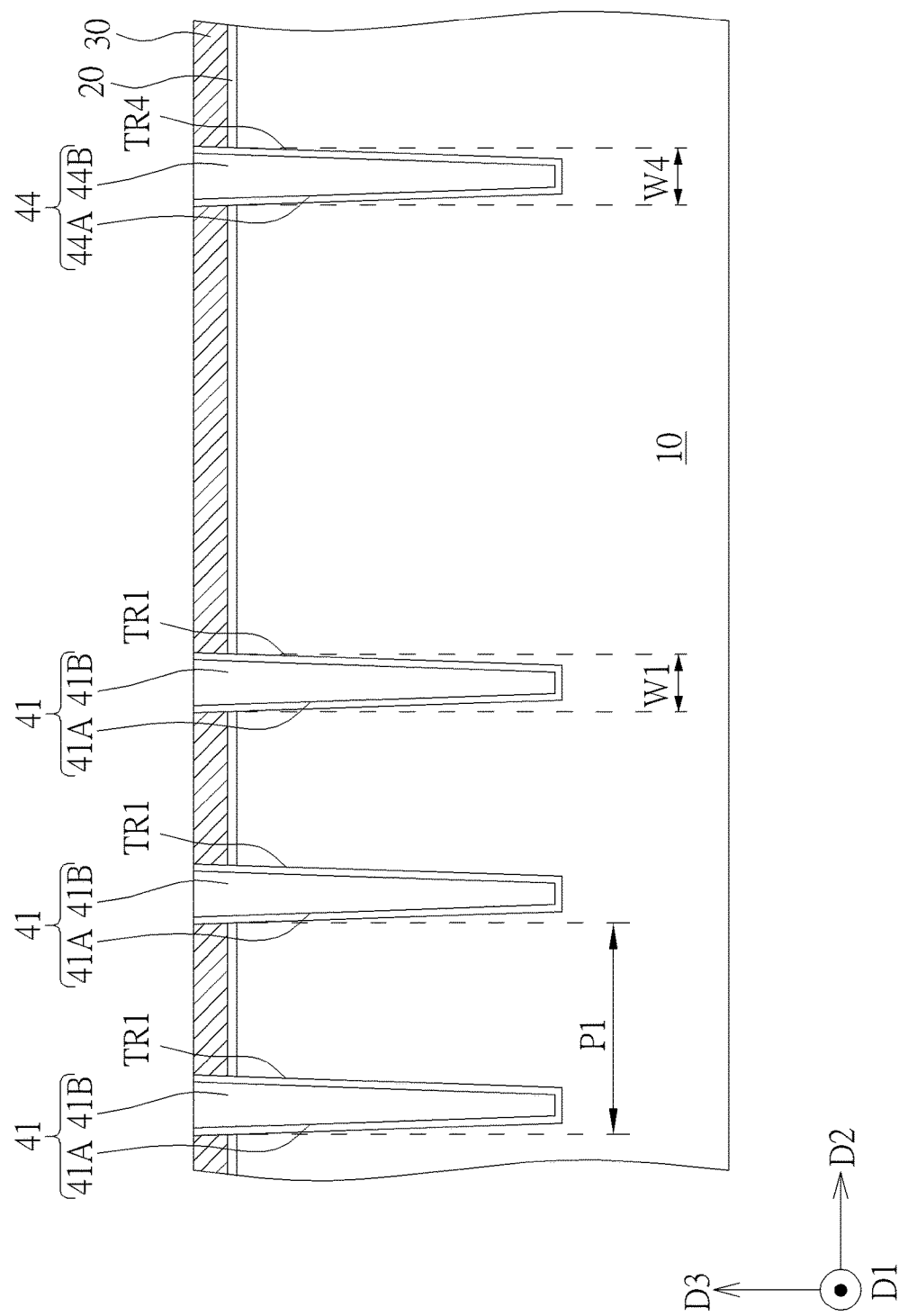
Figure 9:
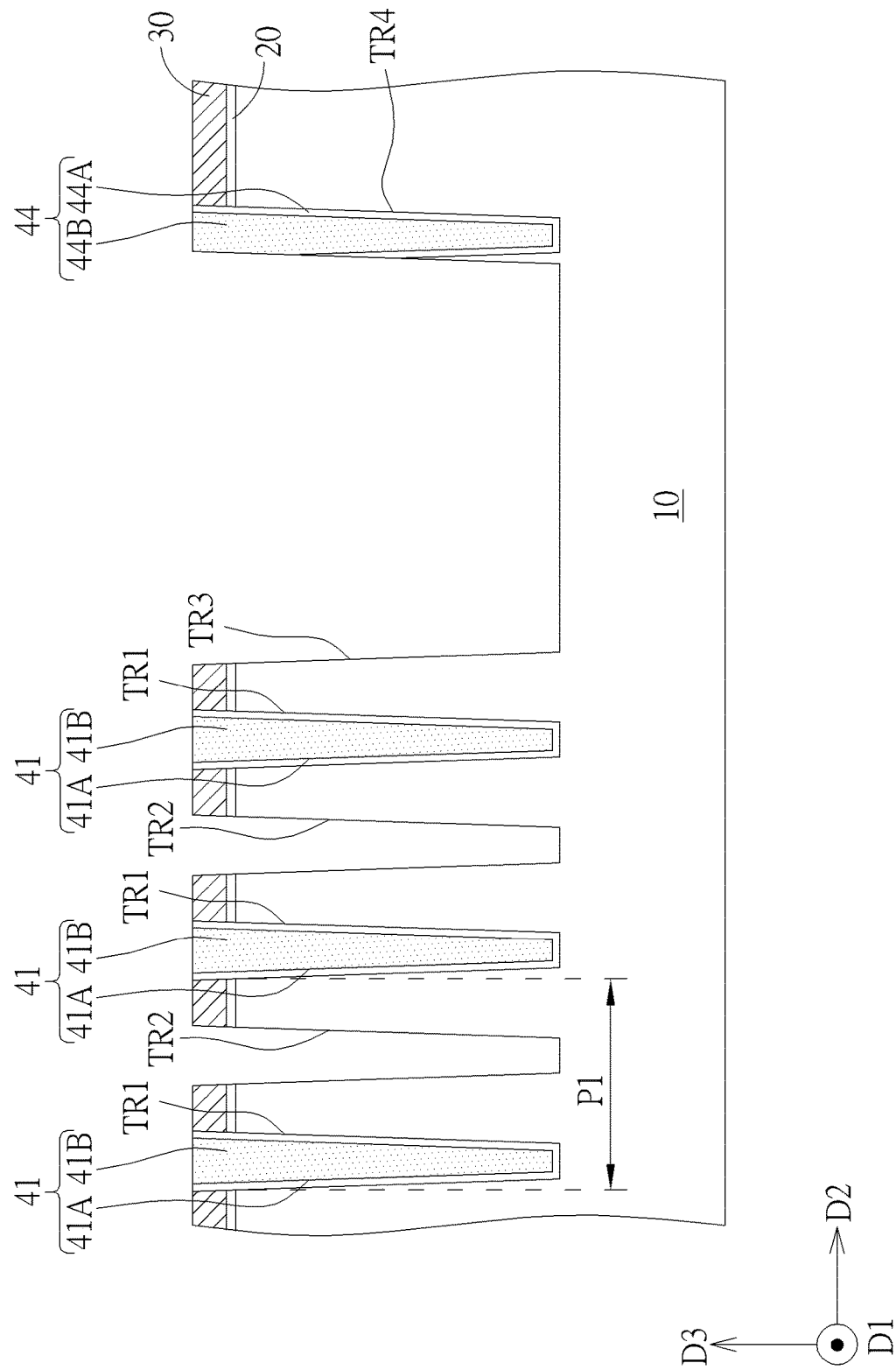
Figure 10:
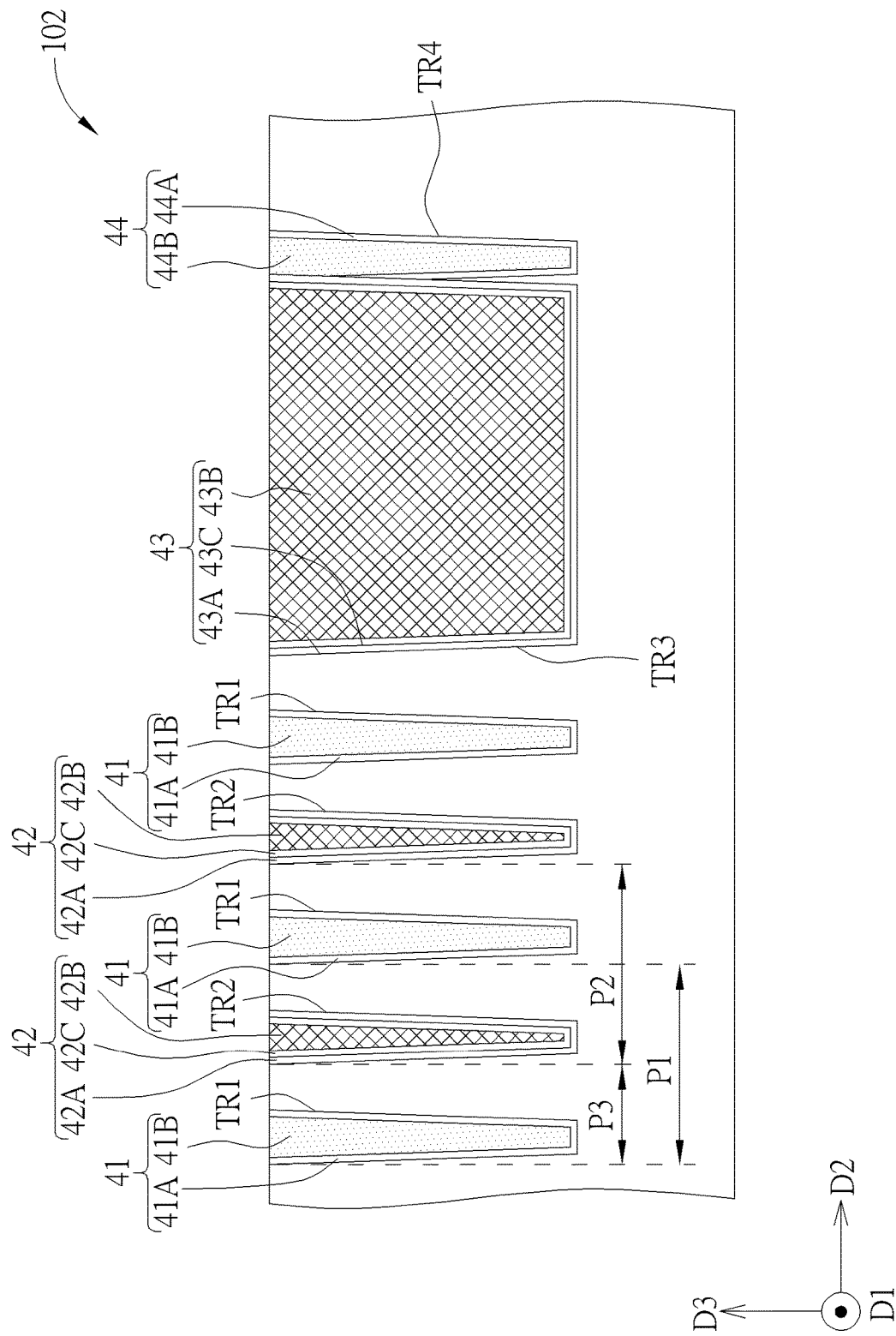

Please refer to FIGS. 8-10. FIGS. 8-10 are schematic drawings illustrating a manufacturing method of a semiconductor structure 102 according to a third embodiment of the present invention. As shown in FIG. 8, the manufacturing method in this embodiment may further include forming a fourth trench isolation 44 in the substrate 10. In some embodiments, the fourth trench isolation 44 and the first trench isolations 41 may be formed by the same step. Specifically, the fourth trench isolation 44 may be formed in a fourth trench TR4 formed in the substrate 10. The fourth trench TR4 and the first trenches TR1 may be formed simultaneously by the same patterning process, but not limited thereto. The fourth trench isolation 44 may be formed by filling the fourth trench TR4 with a fourth liner 44A and a fourth gap filling material 44B. In some embodiments, a material of the fourth trench isolation 44 may be the same as the material of the first trench isolations 41, but not limited thereto. In other words, the fourth liner 44A may be the same as the first liner 41A, and the fourth gap filling material 44B may be the same as the first gap filling material 41B, but not limited thereto. Additionally, a width of the fourth trench isolation 44 in the second direction D2 (such as a fourth width shown in FIG. 8) may be equal to or different from the first width W1 of each of the first trench isolations 41. A distance between the fourth trench isolation 44 and one of the first trench isolations 41 formed immediately adjacent to the fourth trench isolation 44 may be larger than the distance between two adjacent first trench isolations 41 in the second direction D2.

As shown in FIG. 9 and FIG. 10, the second trench isolations 42 and the third trench isolation 43 are then formed in the substrate 10. In this embodiment, the third trench isolation 43 may be formed at a side of the fourth trench isolation 44, and the third trench isolation 43 may be directly connected with the fourth trench isolation 44. Specifically, the third trench TR3 in this embodiment may be partially formed in the fourth trench isolation 44, and the third liner 43A of the third trench isolation 43 may directly contact the fourth liner 44A or the fourth gap filling material 44B of the fourth trench isolation 44. Additionally, each of the second trench isolations 42 may further include a first barrier layer 42C disposed between the second liner 42A and the second gap filling material 42B, and the third trench isolation 43 may further include a second barrier layer 43C disposed between the third liner 43A and the third gap filling material 43B. The first barrier layer 42C and the second barrier layer 43C may be formed by the same process and the same material, such as silicon nitride or other suitable barrier materials. In other words, the material of the third trench isolation 43 may be the same as the material of the second trench isolations 42, but not limited thereto. The material of the second barrier layer 43C may be different from the material of the third liner 43A and the third gap filling material 43B. Accordingly, the semiconductor structure 102 in this embodiment may further include the fourth trench isolation 44 disposed in the substrate 10, and a material of the fourth trench isolation 44 may be different from the material of the third trench isolation 43. The fourth trench isolation 44 may be disposed at one side of the third trench isolation 43, and the third trench isolation 43 is directly connected with the fourth trench isolation 44. The third trench isolation 43 may include the third liner 43A, the third gap filling material 43B disposed on the third liner 43A, and the second barrier layer 43C disposed between the third liner 43A and the third gap filling material 43B. The fourth trench isolation 44 disposed at a side of the third trench isolation 43 may be used to increase the distance between the second barrier layer 43C and an active area in the substrate 10 along the second direction D2, and problems such as hot-electron-induced punch through (HEIP) generated by electrons trapped in the second barrier layer 43C may be improved accordingly. In some embodiments, there may be two or more fourth trench isolations 44 formed at different sides of the third trench isolation 43 for improving the related problems.

Figure 11:
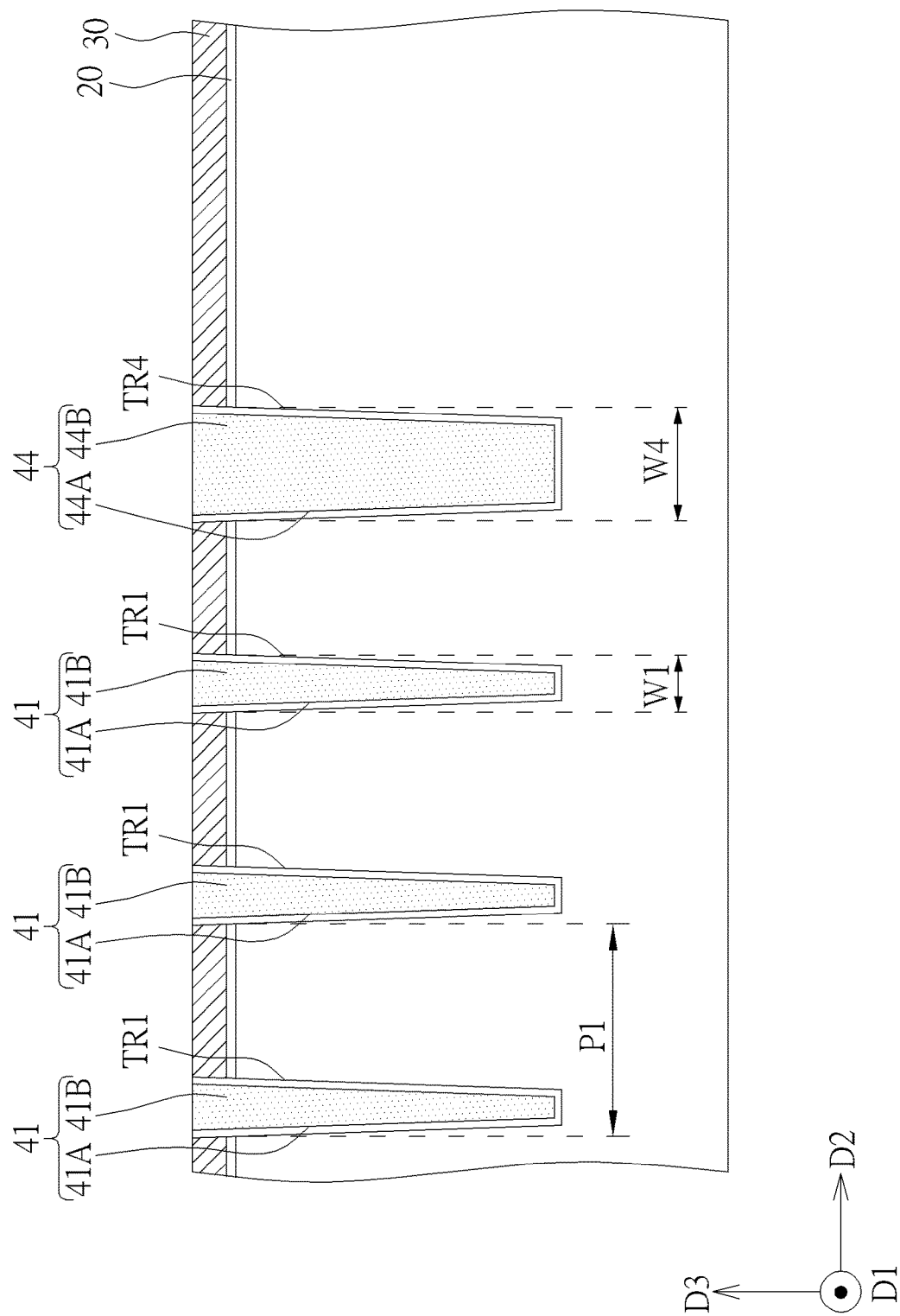
Figure 12:
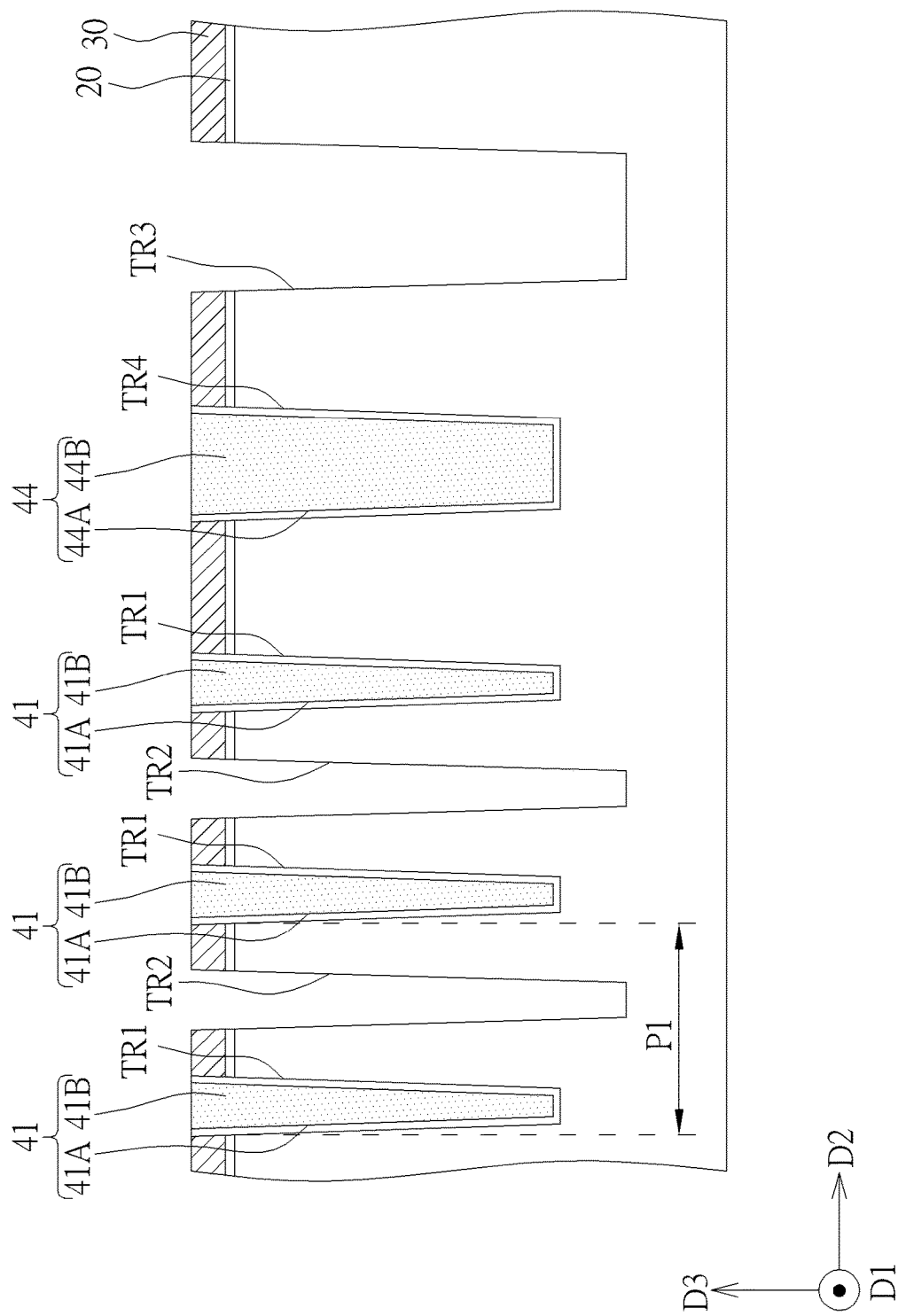
Figure 13:
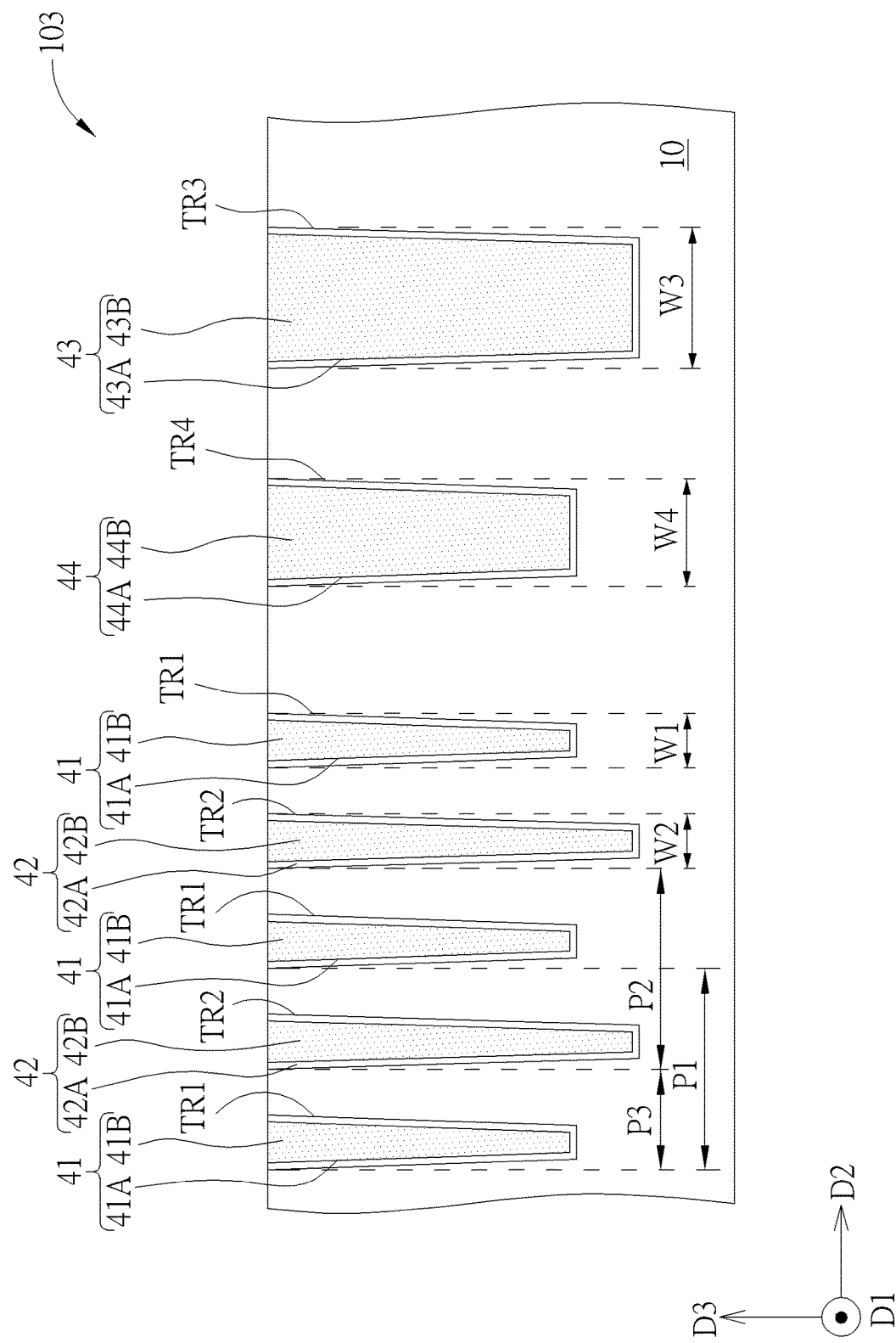

Please refer to FIGS. 11-13. FIGS. 11-13 are schematic drawings illustrating a manufacturing method of a semiconductor structure 103 according to a fourth embodiment of the present invention. As shown in FIG. 11, the fourth width W4 of the fourth trench isolation 44 may be different from the first width W1 of each of the first trench isolations 41. As shown in FIG. 12 and FIG. 13, the depth of each of the second trenches TR2 and the depth of the third trench TR3 may be different from the depth of each of the first trenches TR1 and the depth of the fourth trench TR4. Accordingly, the depth of each of the first trench isolations 41 may be different from the depth of each of the second trench isolations 42, and the depth of the fourth trench isolation 44 may be different from the depth of the third trench isolation 43. In some embodiments, the depth of each of the second trench isolations 42 may be larger than the depth of each of the first trench isolations 41 because the second trench isolations 42 are formed after the step of forming the first trench isolations 41 and the second trenches TR2 with higher aspect ratio require the supporting structure for avoiding the pattern bending issue.

To summarize the above descriptions, according to the semiconductor structure and the manufacturing method thereof in the present invention, the second trench isolations are formed after the step of forming the first trench isolations, and the first trench isolations may be used as the supporting structures during the step of forming the second trench isolations for avoiding the pattern bending issue in the process of forming the second trench isolations especially when the aspect ratio of each of the second trenches and/or each of the first trenches is respectively high. The manufacturing yield and the device performance may be improved accordingly. Additionally, the material of the first trench isolations may be different from the material of the second trench isolations because the first trench isolations and the second trench isolations are formed by separated processes. The application scope of the semiconductor structure may be widened accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A manufacturing method of a semiconductor structure, comprising:
   forming a plurality of first trench isolations, wherein at least a part of each of the first trench isolations is formed in a substrate;
   forming a plurality of second trench isolations in the substrate after the step of forming the first trench isolations, wherein each of the first trench isolations is parallel with each of the second trench isolations, one of the second trench isolations is formed between two of the first trench isolations adjacent to each other, and a pitch between the first trench isolations is equal to a pitch between the second trench isolations;
   forming a third trench isolation in the substrate, wherein a width of the third trench isolation is larger than a width of each of the first trench isolations and a width of each of the second trench isolations; and
   forming a fourth trench isolation in the substrate, wherein the fourth trench isolation and the first trench isolations are formed by the same step, the third trench isolation is formed at a side of the fourth trench isolation, and the third trench isolation is directly connected with the fourth trench isolation.

2. The manufacturing method according to claim 1, wherein the step of forming the first trench isolations comprises forming a plurality of first trenches in the substrate and filling the first trenches with a first gap filling material, and the step of forming the second trench isolations comprises forming a plurality of second trenches in the substrate and filling the second trenches with a second gap filling material, wherein the second trenches are formed after the step of filling the first trenches with the first gap filling material.

3. The manufacturing method according to claim 2, wherein the second gap filling material is different from the first gap filling material.

4. The manufacturing method according to claim 2, wherein the step of forming the first trench isolations further comprises:
   forming a mask layer on the substrate, wherein the first trenches are defined by the mask layer; and
   removing the mask layer after the step of forming the first trenches; and
   forming a sidewall spacer on the substrate and on sidewalls of each of the first trench isolations after the step of removing the mask layer, wherein the second trenches are defined by the sidewall spacer.

5. The manufacturing method according to claim 1, wherein the third trench isolation and the second trench isolations are formed by the same step.

6. The manufacturing method according to claim 5, wherein a material of the third trench isolation is the same as a material of the second trench isolations, and the material of the third trench isolation is different from a material of the first trench isolations.

7. The manufacturing method according to claim 1, wherein a depth of each of the first trench isolations is different from a depth of each of the second trench isolations.

8. A semiconductor structure, comprising:
a substrate;
a plurality of first trench isolations disposed in the substrate; and
a plurality of second trench isolations disposed in the substrate, wherein each of the first trench isolations is parallel with each of the second trench isolations, one of the second trench isolations is disposed between two of the first trench isolations adjacent to each other, and a pitch between the first trench isolations is equal to a pitch between the second trench isolations, wherein a material of the first trench isolations is different from a material of the second trench isolations;
a third trench isolation disposed in the substrate, wherein a material of the third trench isolation is different from the material of the first trench isolations or the material of the second trench isolations; and
a fourth trench isolation disposed in the substrate, wherein a material of the fourth trench isolation is different from the material of the third trench isolation, the fourth trench isolation is disposed at one side of the third trench isolation, and the third trench isolation is directly connected with the fourth trench isolation.

9. The semiconductor structure according to claim 8, wherein a width of the third trench isolation is larger than a width of each of the first trench isolations and a width of each of the second trench isolations.

10. The semiconductor structure according to claim 8, wherein the third trench isolation comprises:
a liner;
a gap filling material disposed on the liner; and
a barrier layer disposed between the liner and the gap filling material.

11. The semiconductor structure according to claim 8, wherein the material of the fourth trench isolation is the same as the material of the first trench isolations.

12. The semiconductor structure according to claim 11, wherein the material of the third trench isolation is the same as the material of the second trench isolations.

13. The semiconductor structure according to claim 8, wherein a depth of the fourth trench isolation is different from a depth of the third trench isolation.

14. The semiconductor structure according to claim 8, wherein a depth of each of the first trench isolations is different from a depth of each of the second trench isolations.

* * * * *